(12) United States Patent
Sasaki et al.

(10) Patent No.: US 7,532,458 B2
(45) Date of Patent: May 12, 2009

(54) ELECTRIC CONNECTION BOX

(75) Inventors: Yoshikazu Sasaki, Yokkaichi (JP); Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 259 days.

(21) Appl. No.: 11/546,335

(22) Filed: Oct. 12, 2006

(65) Prior Publication Data

US 2007/0086152 A1   Apr. 19, 2007

(30) Foreign Application Priority Data

Oct. 14, 2005 (JP) ............................. 2005-300624
Mar. 9, 2006 (JP) ............................. 2006-064708

(51) Int. Cl.
*H02B 1/26* (2006.01)
*B60L 1/00* (2006.01)
*H01R 12/00* (2006.01)

(52) U.S. Cl. .................. 361/622; 361/604; 361/641; 361/643; 307/10.1; 439/76.2

(58) Field of Classification Search ............... 361/627, 361/601, 622, 628, 630, 631, 641, 642, 643, 361/646, 748, 752, 715; 307/9.1, 10.1–10.8; 439/76.2

See application file for complete search history.

(56) References Cited

U.S. PATENT DOCUMENTS 4,952,753 A * 8/1990 Hayashi et al. ............. 174/559
4,963,099 A * 10/1990 Sato et al. ................... 439/76.2
6,396,163 B1 * 5/2002 Sugiura et al. ............... 307/9.1
6,506,061 B2 * 1/2003 Yuasa et al. ................ 439/76.2
7,156,677 B2 * 1/2007 Yamane ...................... 439/206
7,189,082 B2 * 3/2007 Fukushima et al. ........ 439/76.2
7,333,337 B2 * 2/2008 Kita .......................... 361/710
2002/0067077 A1 * 6/2002 Hentschel et al. .......... 307/10.1
2003/0137813 A1   7/2003 Onizuka et al.
2004/0001319 A1   1/2004 Kawakita et al.
2005/0221643 A1 * 10/2005 Tomikawa et al. ............ 439/79

FOREIGN PATENT DOCUMENTS

| JP | A 10-35375 | 2/1998 |
| JP | A 2003-164039 | 6/2003 |
| JP | A 2004-40873 | 2/2004 |

\* cited by examiner

*Primary Examiner*—Jayprakash N Gandhi
*Assistant Examiner*—Zachary M Pape
(74) *Attorney, Agent, or Firm*—Oliff & Berridge, PLC (57) ABSTRACT

Fluid drainage slopes are formed at a lower frame part constituting a housing that is provided below circuit board housed inside housing. Drainage ports are also formed at a lowermost part of fluid drainage slope in lower frame part. Thus, fluid that forms in the housing flows down from circuit board and onto fluid drainage slopes to be guided downward from fluid drainage slope to reach drainage ports and be discharged to outside housing. It is thus possible to prevent or suppress the occurrence of short circuits in a circuit board caused by fluid generated and/or accumulated inside the housing.

17 Claims, 11 Drawing Sheets

ELECTRIC CONNECTION BOX

CROSS REFERENCE TO RELATED APPLICATION

This application claims priority from Japanese Patent Application No. 2005-300624 filed Oct. 14, 2005 and Application No. 2006-064708 filed Mar. 9, 2006. The entire content of these priority applications is incorporated herein by reference.

TECHNICAL FIELD

This disclosure relates to an electric connection box.

BACKGROUND

Conventionally, as an electric connection box that is mounted on a vehicle, a device is known in which the circuit board is contained inside the housing and is provided between a power source and electrical equipment to control the passage and disconnection of power to the electrical equipment. In this electric connection box, the housing is sealed with a sealing material or the like so that moisture cannot penetrate into the housing as a result of rain or when washing the vehicle or the like.

However, in the electric connection box to be mounted on a vehicle as described above, in some cases the temperature or level of humidity may vary greatly at the installation position of the electric connection box due to changes in weather or the running conditions of the vehicle and the like. In that case, there is a concern that moisture in the air inside the housing will condense and generate water inside the housing. When that water is not discharged from the housing, the water accumulates on the inner surface of the bottom wall of the housing. If moisture that accumulated within the housing comes into contact with the circuit board, there is a concern that an electrical circuit formed in the circuit board will be short-circuited.

Thus, there is a need in the art for an electric connection box that can discharge fluid that is generated within the housing to outside.

SUMMARY

One embodiment according to the present invention is an electric connection box comprising a circuit board; a housing that houses the circuit board internally in a vertical state and has a bottom wall below the circuit board; a fluid drainage slope that is formed in the bottom wall of the housing and receives water that flows and drops from the circuit board, and is formed in a downslope to guide the water downward in succession; and a drainage port formed at a position in a lowermost part of the fluid drainage slope in the bottom wall of the housing, and that communicates inside and outside of the housing.

Thus fluid or water that is generated within the housing due to, for example, condensation and attached to the surface of the circuit board runs down from the circuit board and drops on top of the water drainage slope. Water that dropped onto the water drainage slope flows down the water drainage slope along the downslope and is discharged to outside the housing from the drainage port formed at the lowermost part of the water drainage slope. It is thereby possible to prevent short-circuiting of the circuit board that is caused by water generated within the housing.

BRIEF DESCRIPTION OF THE DRAWINGS

Illustrative aspects in accordance with the invention will be described in detail with reference to the following figures wherein.

DETAILED DESCRIPTION OF THE PRESENT INVENTION

Figure 1:
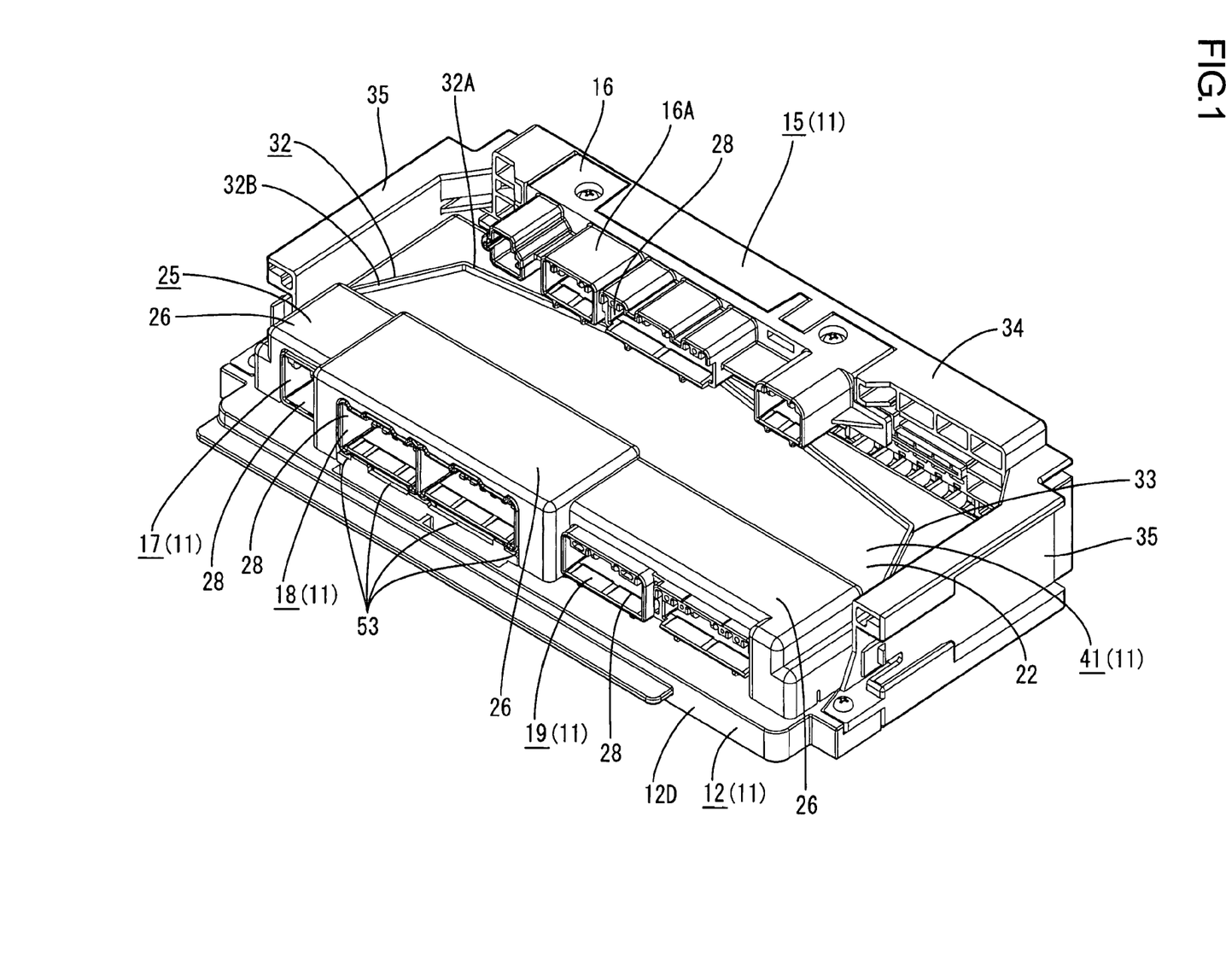
FIG. 1 is an oblique perspective view of an electric connection box according to one aspect of the invention.
Figure 2:
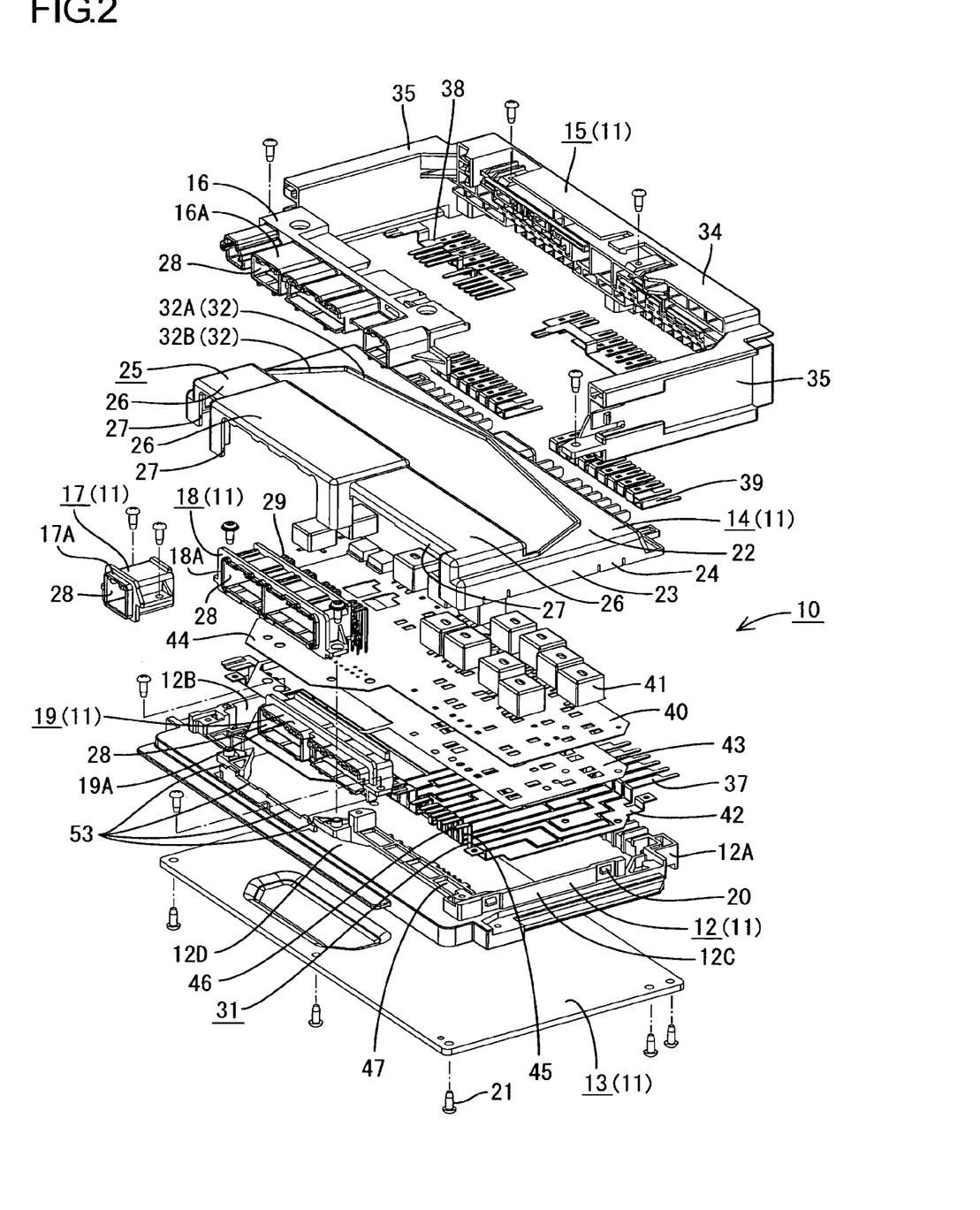
FIG. 2 is an exploded oblique perspective view showing the electric connection box.
Figure 3:
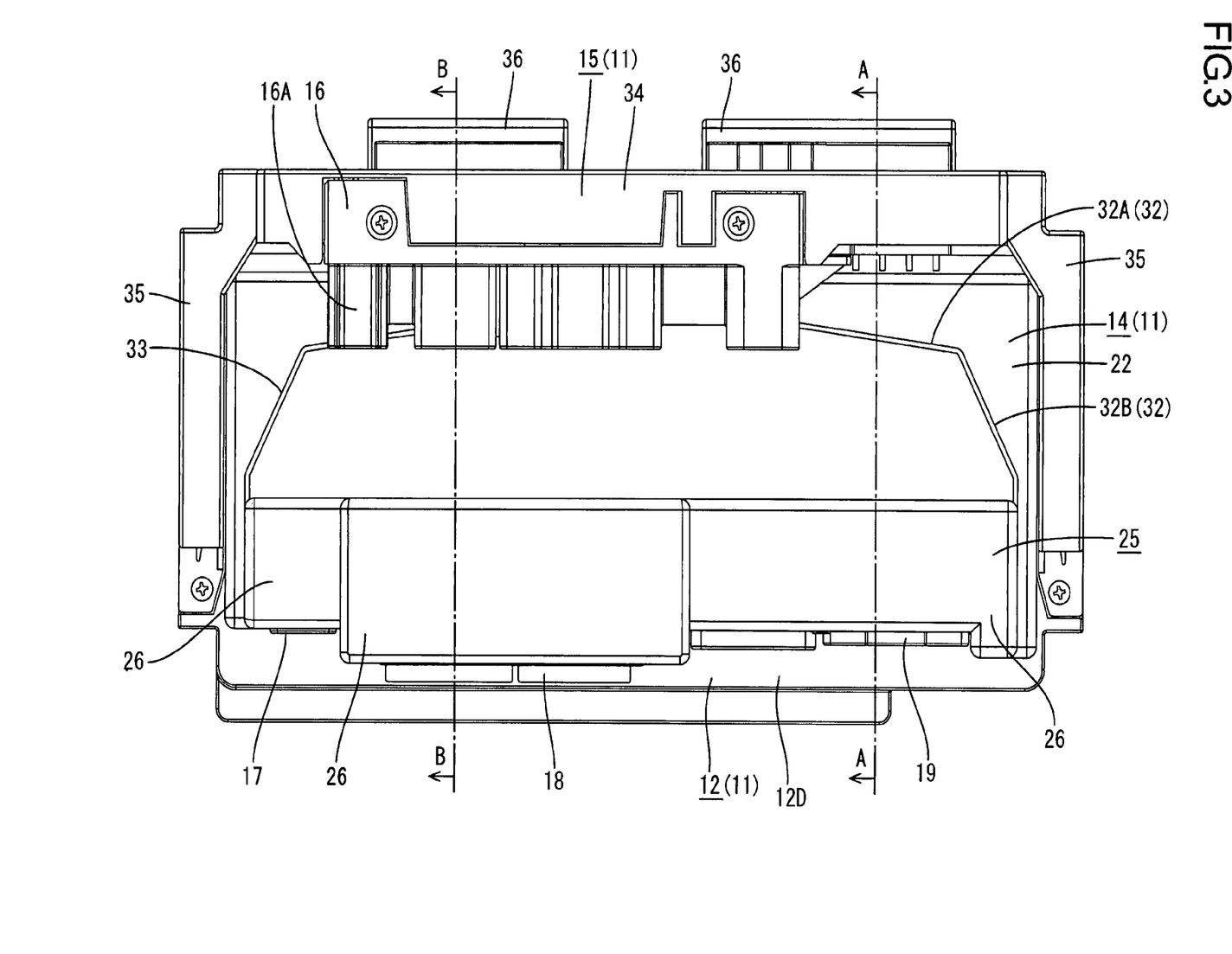
FIG. 3 is a front view of the electric connection box.
Figure 5:
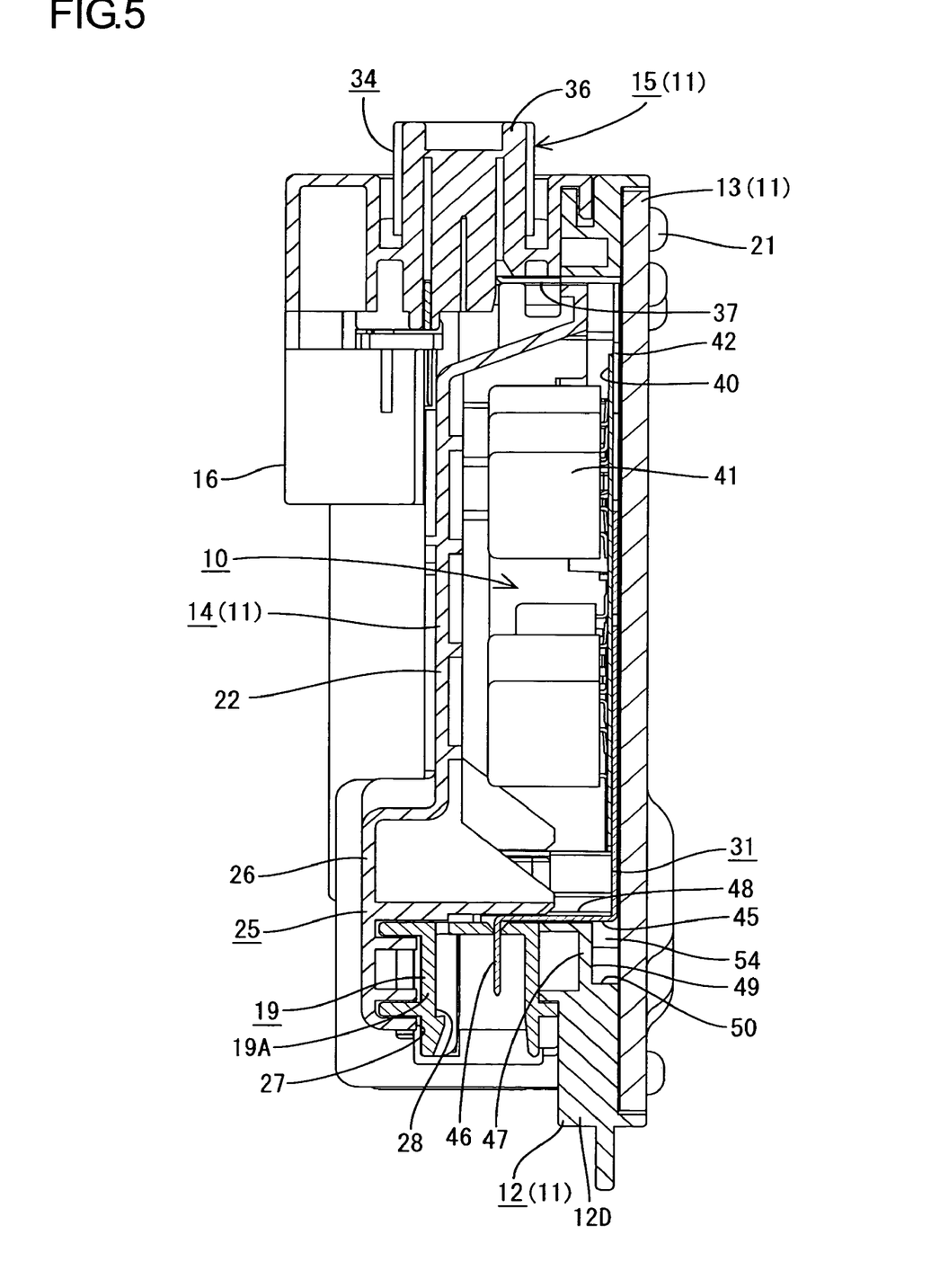
FIG. 5 is a cross-sectional view along the line A-A shown in FIG. 3.
Figure 6:
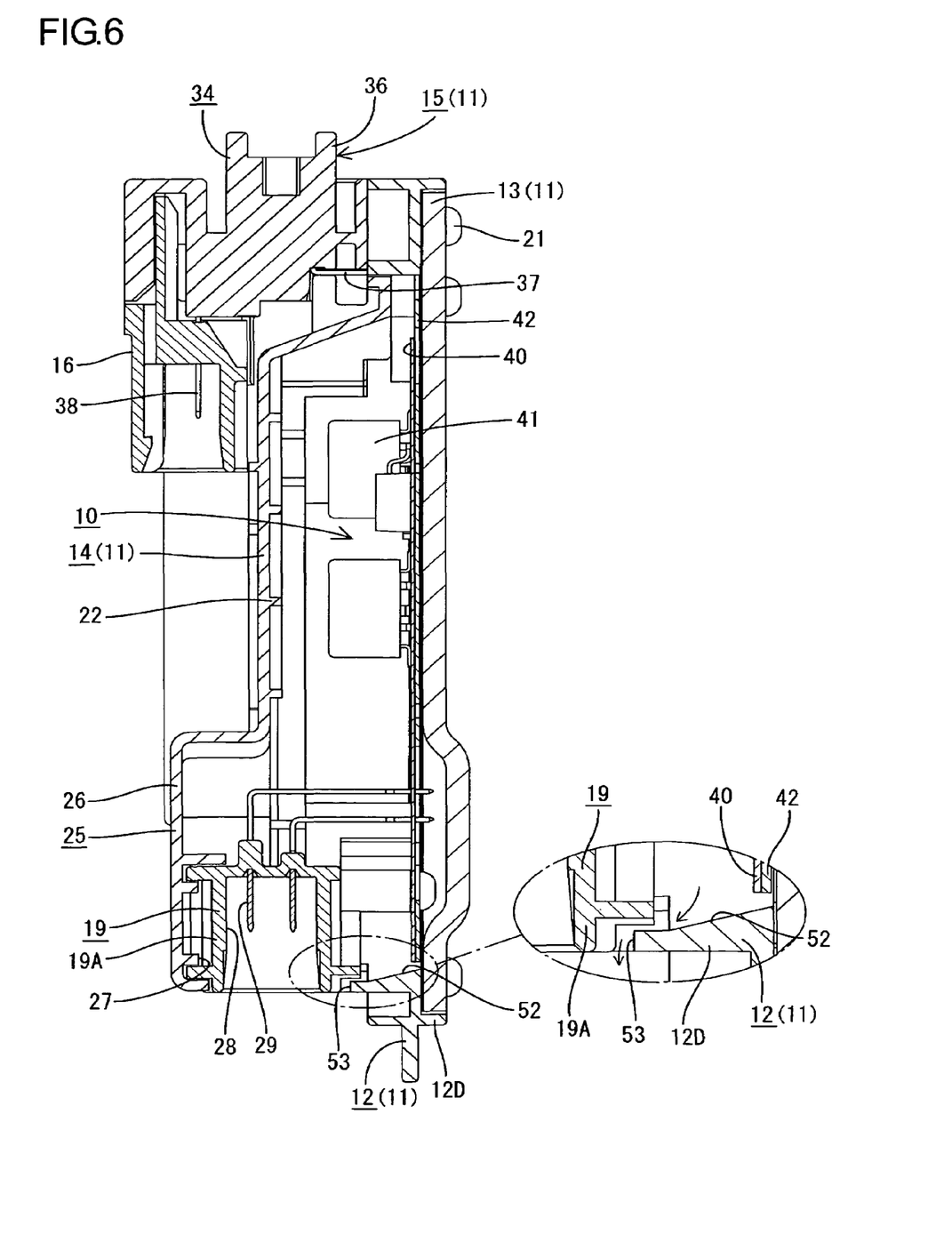
FIG. 6 is a cross-sectional view along the line B-B shown in FIG. 3.

One embodiment of the present invention will be described with reference to FIG. 1 to FIG. 8. The electric connection box according to this embodiment is mounted in a vehicle, and is provided between an unshown power source and unshown electrical equipment such as a lamp or audio apparatus to control the passage and disconnection of power for each piece of electrical equipment. The electric connection box houses a circuit board 10 inside a housing 11 formed in a flat shape. In FIG. 1 and FIG. 2, although the electric connection box is depicted so that the front surface side is upward, in a state in which the electric connection box is mounted in a vehicle, as shown in FIG. 5 and FIG. 6 the electric connection box is arranged so as to be disposed in a vertical manner so that a board surface of the circuit board 10 is vertical. Here under, orientations to the left, right, top and bottom are described based on the state in which the electric connection box is mounted in the vehicle.

The housing 11 includes a frame 12 comprising, for example, synthetic resin that opens in the front and rear directions (horizontal direction in FIG. 5 and FIG. 6); a heat sink 13 made of metal that is attached so as to block the opening on the rear surface side (right side in FIG. 5 and FIG. 6) of the frame 12; a cover 14 made of synthetic resin that is arranged so as to block the opening on the front surface side (left side in FIG. 5 and FIG. 6) of the frame 12; a fuse block 15 made of synthetic resin that is arranged with respect to the frame 12 from the top side thereof; a first connector 16 made of synthetic resin that is arranged in the fuse block 15; and second to fourth connectors 17, 18, and 19 made of synthetic resin that are arranged at a lower edge of the frame 12.

The frame 12 forms a substantially rectangular frame shape along the periphery of the circuit board 10 and comprises an upper frame part 12A; a left frame part 12B and a right frame part 12C that extend downward from the left and right ends of the upper frame part 12A; and a lower frame part 12D (corresponds to the bottom wall of the present invention) that links the lower edges of the left and right frame parts 12B and 12C. The lower frame part 12D is an edge part that adjoins and corresponds to the lower edge of the circuit board 10, and is positioned almost directly below the lower edge of the circuit board 10. On the outside surface of the left and right frame parts 12B and 12C are formed lock protrusions 20 that protrude to outside.

The heat sink 13 that is mounted on the rear surface of the frame 12 forms a substantially rectangular shape that is roughly analogous with the outer shape of the frame 12. The heat sink 13 is fixed to the rear surface of the frame 12 with unshown adhesive, and screwed onto the rear surface by bolts 21.

The cover 14 is formed on the whole in a shallow dish shape that opens to the rear surface side. The cover 14 includes a cover plate 22 that forms on the whole a shape that is substantially analogous with the outer shape of the frame 12 and covers the opening on the front surface side of the frame 12, and a lateral wall 23 that rises to the rear surface side along the rim of the cover plate 22. Brackets 24 are formed in the lateral wall 23 of the cover 14 at positions that correspond with the lock protrusions 20 of the frame 12. The cover 14 can be attached to the frame 12 from the front surface side through resilient engagement of the brackets 24 with the lock protrusions 20.

The lower part of the cover 14 expands to the front side (left direction in FIG. 5) while keeping the left and right edges, and this expansion part serves as a connector accommodating part 25. The connector accommodating part 25 is separated into three hoods 26. An opening 27 is formed in the undersurface of each of the hoods 26, and the second to fourth connectors 17, 18, and 19 are disposed in these openings 27 so as to close off the openings 27. The second to fourth connectors 17, 18, and 19 have respective connector housings 17A, 18A and 19A, and a mating opening 28 that opens downward is provided in each of the connector housings 17A, 18A and 19A. Respective counterpart connectors (not shown) are arranged inside the mating openings 28. The third connector 18 can be attached to the circuit board 10. One end of a rod-shaped terminal fitting 29 is inserted from the upper side at the top of the connector housing 18A of the third connector 18. The other end of the terminal fitting 29 is bent at a substantially right angle to the rear surface side and is inserted into a through hole 30 formed in the circuit board 10 to connect with an electrical circuit formed on the circuit board 10. The lower end of a lower side protrusion 31 to be described later is inserted from the upper side of the connector housing 19A of the fourth connector 19 to serve as a terminal fitting 46 that is described later.

On the external surface of the cover plate 22 of the cover 14, a canopy 32 is provided in a condition that extends in the front direction (left direction of FIG. 5) at a location above the connector accommodating part 25 in a position slightly below the upper edge of the cover plate 22. The canopy 32 forms a rib shape that continues to extend in the horizontal direction, and takes the center position in the horizontal direction as a ridge line to incline in a downslope from there to the left and right. In the canopy 32, an area as far as positions that are slightly more inward than positions corresponding to the left and right edges of the connector accommodating part 25 serves as a gentle sloping part 32A that inclines in a gentle downslope, and the external side from there serves as a steep sloping part 32B that inclines in a downslope that is steeper than the gentle sloping part 32A. As a result, the top surface of the canopy 32 serves as an inclined plane 33 that takes the center position in the horizontal direction as a ridge line and inclines in a downslope from that point to the left and right. The lower end of the steep sloping part 32B is connected to the upper edge at the left and right ends of the connector accommodating part 25. Thus, the edge of the canopy 32 continues to the respective left and right sides on the outer surface of the connector accommodating part 25.

The fuse block 15 comprises an oblong main unit 34 that is disposed along the upper edge of the frame 12 and whose front portion protrudes further to the front side than the cover 14, and a pair of arm parts 35 that extend in a cantilever shape downward from the ends of the left and right sides of the main unit 34.

On the top surface of the main unit 34, two left and right fuse accommodating parts 36 for housing unshown fuses project in a square block shape further upward than the top surface of the main unit 34, and are formed in a shape that opens to the top surface side. From the lower side of the main unit 34, the upper end of a top side protrusion 37 to be described later is inserted from the lower side.

The first connector 16 is mounted from the lower side in a portion that projects to the front side in this fuse block 15. The first connector 16 has a connector housing 16A. A mating opening 28 that opens downward is provided in this connector housing 16A. An unshown external connector can be mated with this mating opening 28. A substantially lower half region of a terminal fitting 38 is contained within the mating opening 28, and a substantially upper half region of the terminal fitting 38 is inserted into the main unit 34 from the lower side. The terminal fitting 38 and the top side protrusion 37 are connected through a fuse and a relay terminal 39 inside the main unit 34.

The circuit board 10 forms a control circuit by printed wiring means on the front surface (left surface side in FIG. 5) of an insulating substrate 40 formed in a substantially rectangular shape, and is configured by mounting a switching element 41 such as a relay on this control circuit. On the rear surface (right surface side in FIG. 5), a plurality of bus bars 42 are aligned in a state in which they are electrically connected with the control circuit. An unshown waterproof sealing agent is applied on the front surface of the circuit board 10. The bus bars 42 are adhered to the rear surface of the insulating substrate 40 through an adhesive sheet 43. The circuit board 10 is housed inside the housing 11 in a state in which the board surface thereof faces in a vertical direction. Among the areas on the lower edge of the insulating substrate 40, the area on the left inner side in FIG. 2 protrudes downward in a substantially trapezoidal shape to form a connector attachment part 44 for attaching the third connector 18. The top side protrusions 37 formed at the end of the bus bars 42 protrude side by side from the top edge of the insulating substrate 40. Further, lower side protrusions 31 formed at the ends of the bus bars 42 protrude side by side from an area on the substantially left half of the lower edge of the insulating substrate 40 in FIG. 4. In this connection, the circuit board 10 and the heat sink 13 are attached by means of an adhesive (not shown) applied to the rear surface of the bus bars 42.

At the lower side protrusion 31 is formed a curved part 45 that protrudes to the front and is bent so as to be substantially perpendicular with the board surface of the circuit board 10, as well as a terminal fitting 46 that is bent in a substantially right angle downward from the tip of the curved part 45 to protrude downward, and that can connect with a counterpart connector provided in the fourth connector 19.

A support part 47 that supports from below the curved part 45 formed in the lower side protrusion 31 of the bus bar 42 is formed in an area substantially on the left half of the lower frame part 12D of the frame 12 in FIG. 4. By means of this support part 47 it is possible to prevent the curved part from being displaced downward when separating a counterpart connector that is mated with the fourth connector 19. On the top surface of the support part 47, a plurality of barrier walls 48 that separate adjacent curved parts 45 from each other are provided in a condition in which they protrude in an upward direction between adjacent curved parts 45. The height dimensions in the vertical direction of the barrier walls 48 are designed to be slightly greater than the thickness dimensions in the vertical direction of the curved parts 45. Thus, in comparison to a case in which the barrier walls 48 are not provided, it is possible to increase the distance between adjacent curved parts 45.

At the side face of the rear surface side (circuit board 10 side) of the support part 47, a concave portion 49 that forms a recess into the front surface side is formed from the top edge of the support part 47 to an area at a position somewhat lower down. The undersurface of this concave portion 49 is formed in a downward slope from the left side to the right side in FIG. 4 and serves as a first water drainage slope 50 for receiving water that runs down from the circuit board 10 and guiding the water downward in succession. As shown in FIG. 5, the first water drainage slope 50 is formed so as to be positioned below the circuit board 10. An area in the substantially right half of the lower frame part 12D in FIG. 4 serves as an accommodating part 51 for accommodating the connector attachment part 44 of the circuit board 10, and forms a recess in a downward direction such that it substantially joins in an aligned manner with the external form of the connector attachment part 44. The right end of the first water drainage slope 50 in FIG. 4 is arranged to extend to the left side surface of the connector attachment part 44 in FIG. 4. The bottom surface of the accommodating part 51 is formed in a downward slope toward the front side (see FIGS. 6 and 8), and serves as a second water drainage slope 52 for guiding the water that ran down from the first water drainage slope 50 further downward. As shown in FIG. 6, the second water drainage slope 52 is provided at a position below the connector attachment part 44 of the circuit board 10. At the left near side on the front surface side of the lower frame part 12D in FIG. 8 that is the lowermost part of the second water drainage slope 52, four concave portions are formed in a manner in which they are recessed into the rear surface side. The interior and exterior of the housing 11 communicate by means of spaces formed between these concave portions and the external wall of the connector housing 18A of the third connector 18, and these spaces serve as drainage ports 53 that discharge water from inside the housing 11 to outside the housing 11 (see FIG. 1).

Figure 7:
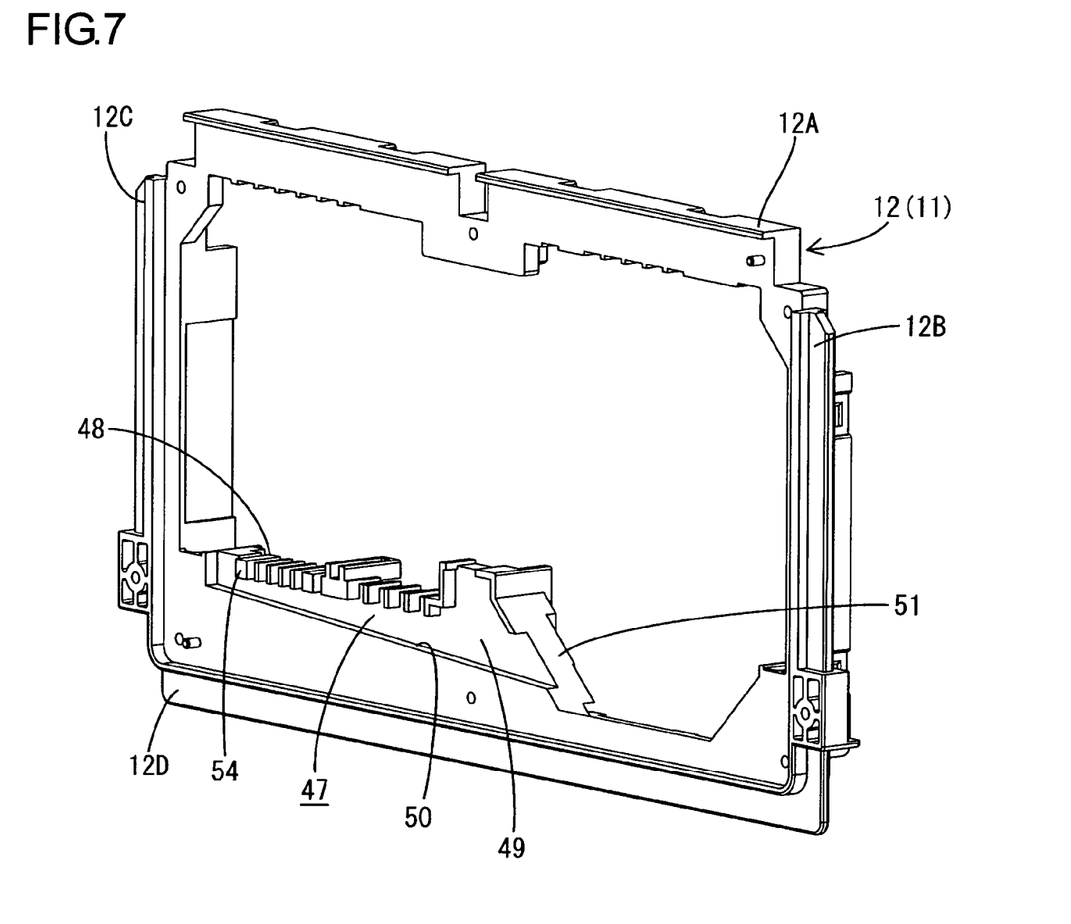
FIG. 7 is an oblique perspective view showing the state of the rear surface side of a frame.
Figure 8:
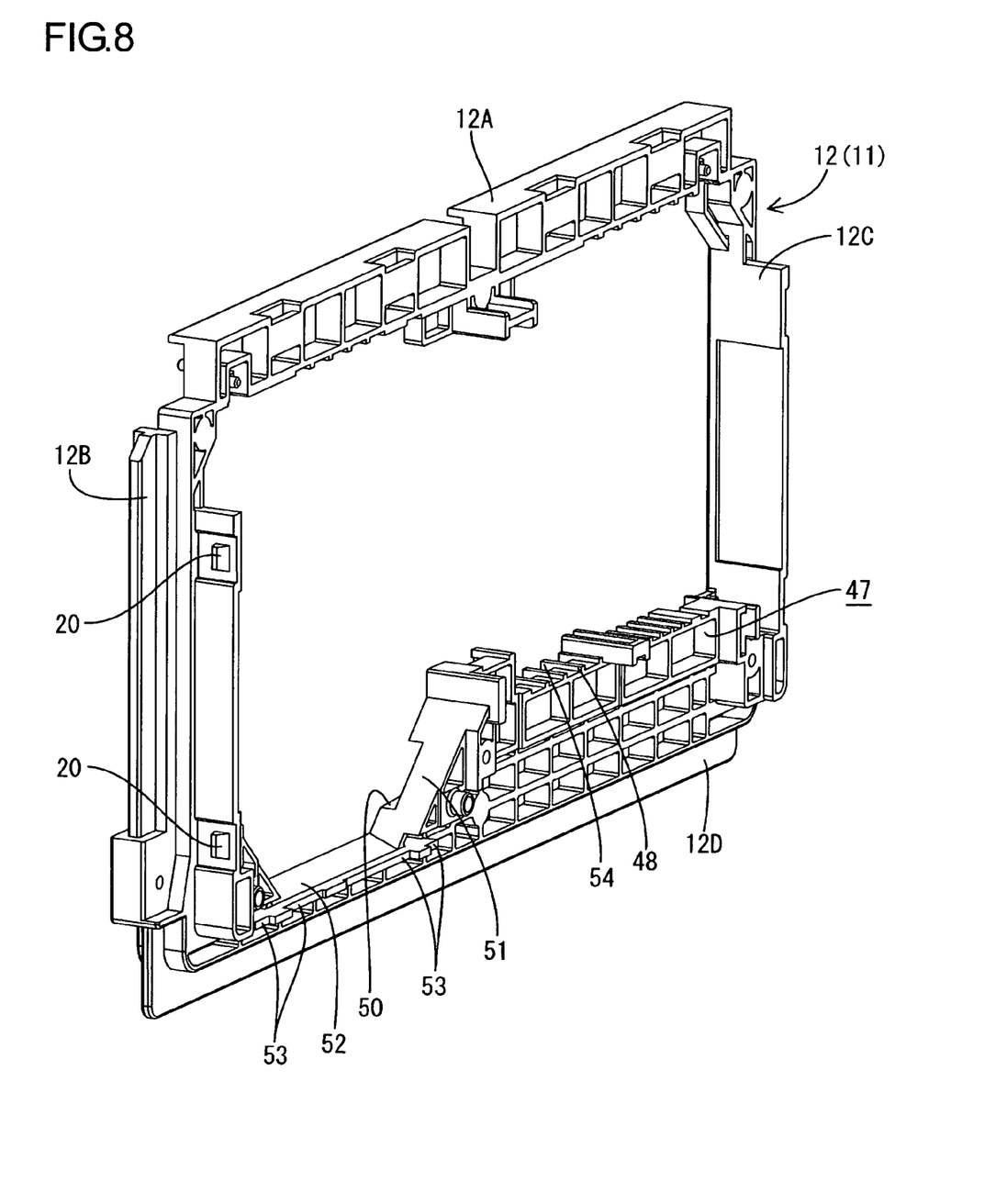
FIG. 8 is an oblique perspective view showing the state of the front surface side of the frame.

As shown in FIG. 5 to FIG. 7, the barrier walls 48 are formed to protrude from the top surface of the support part 47 to the rear surface side, and the edge of the rear surface side is arranged so as to abut against the front surface of the heat sink 13 (see FIG. 5). The lower edge of a part of the barrier walls 48 that protrudes to the rear surface side is formed so as to hang downward, and serves as a draining rib 54 for guiding water downward. The draining ribs 54 are formed at positions above the first water drainage slope 50 (see FIG. 5 and FIG. 7).

With respect to the electric connection box that is mounted in a vehicle, in some cases the temperature or level of humidity at the installation location of the electric connection box will vary greatly due to changes in running conditions and weather and the like. In that case, moisture in air inside the housing 11 may condense to generate water on the surface of the circuit board 10. Since the surface of the circuit board 10 is coated with a waterproof sealing agent, it is possible to prevent short circuiting of an electrical circuit formed on the surface of the circuit board 10.

Since the circuit board 10 is disposed inside the housing 11 in a state in which the board surface thereof is oriented vertically, water that is generated on the surface of the circuit board 10 runs downward. Since the first water drainage slope 50 and the second water drainage slope 52 are formed underneath the circuit board 10, water that falls downward from the lower edge of the circuit board 10 drips onto the first water drainage slope 50 and the second water drainage slope 52.

The lower side protrusion 31 of the bus bar 42 protrudes downward from the lower edge of the circuit board 10, and water that do not drip down from the lower edge of the circuit board 10 runs to this lower side protrusion 31. Subsequently, the water runs to the curved part 45 formed in the lower side protrusion 31 and moves surely to the support part 47 that contacts against the curved part 45 from below. The water that reached the support part 47 runs down the side wall on the circuit board 10 side of the support part 47 and reaches the first water drainage slope 50 that is formed in the support part 47. The barrier walls 48 that separate adjacent curved parts 45 are formed on the support part 47. Since the draining ribs 54 are formed in these barrier walls 48, the water moves swiftly from the curved part 45 to the draining rib 54 and becomes separated from the curved part 45. It is thus possible to still further prevent a short circuit between the curved parts 45. Water that ran to the draining rib 54 flows downward, and drips down from the lower end of the draining rib 54 and is received by the first water drainage slope 50.

In this connection, since the support part 47 is arranged so as to contact against the curved part 45 that is formed between a terminal and portions of the bus bars 42 that are adhered to the circuit board 10, the structure is such that water that runs down from the circuit board 10 does not reach the terminal, and instead runs along the support part 47 and flows down onto the first water drainage slope 50. It is therefore possible to prevent water penetrating into the fourth connector 19 in which the terminal fitting 46 is inserted and causing a short circuit between terminal fittings 46 or with a counterpart connector.

Figure 4:
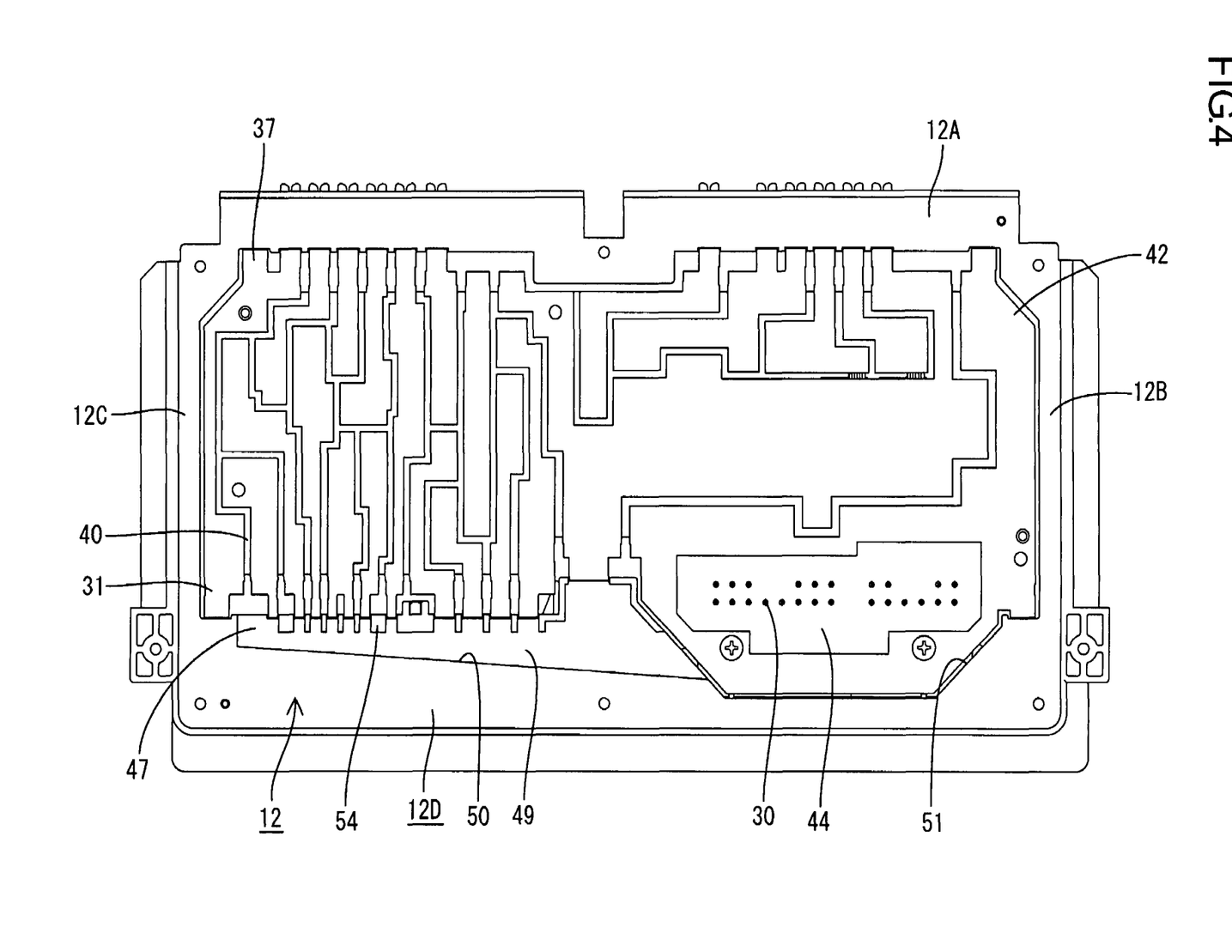
FIG. 4 is a rear view showing a state in which a heat sink is detached from the electric connection box.

Water that arrived at the first water drainage slope 50 flows rightward along the first water drainage slope 50 that is sloped downward to the right in FIG. 4, and arrives at the left side of the accommodating part 51 in FIG. 4. The water then runs down the left side of the accommodating part 51 and arrives at the second water drainage slope 52 formed at the undersurface of the accommodating part 51.

Since the second water drainage slope 52 is formed to slope downwards towards the front side, the water runs down towards the front side and flows downward from the drainage ports 53 formed at the lowermost part of the second water drainage slope 52 and is discharged outside the housing 11 (see the arrows in FIG. 6).

As described above, according to this embodiment, water that is generated inside the housing 11 due to condensation or the like and forms on the surface of the circuit board 10 runs downward along the circuit board 10 that is disposed in a vertical state and flows down from the circuit board 10 to arrive at the first water drainage slope 50 and the second water drainage slope 52. Further, water that did not run down from the circuit board 10 arrives at the lower side protrusion 31 of the bus bar 42 that protrudes downward from the lower edge of the circuit board 10 and runs to the curved part 45 formed in the lower side protrusion 31. The water that arrived at the curved part 45 moves surely to the first water drainage slope 50 by running along the support part 47 that contacts against the curved part 45 and dropping, and running along the draining rib 54 and dropping. Water that moved to the first water drainage slope 50 runs down along the downslope to arrive at the second water drainage slope 52 and is discharged to outside the housing 11 from the drainage ports 53 that are formed at the lowermost part of the second water drainage slope 52. It is thereby possible to prevent or suppress the occurrence of short circuits of the circuit board 10 that are caused by moisture accumulating within the housing 11.

Further, according to this embodiment, since barrier walls 48 are provide that protrude between curved parts 45 in the support part 47, distance between adjacent curved parts 45 can be increased. As a result, since it is difficult for water that forms on one curved part 45 to reach an adjacent curved part 45, short circuits between curved parts 45 can be avoided.

Also, short circuits between the curved parts 45 can be avoided to an even further degree since water that forms on a curved part 45 is guided downward by the draining rib 54 so that it separates from the curved part 45.

According to this embodiment, frame 12 that constitutes the housing 11 forms a frame shape along the periphery of the circuit board 10, and the water drainage slopes 50 and 52 and the drainage ports 53 are provided at an edge part (lower frame part 12D) along the lower edge of the circuit board 10 among the edge parts of the frame 12. As a result, since the water drainage slopes 50 and 52 and the drainage ports 53 are positioned almost directly below the lower edge of the circuit board 10, it is likely for water that forms on the surface of the circuit board 10 to reach the water drainage slopes 50 and 52.

Figure 9:
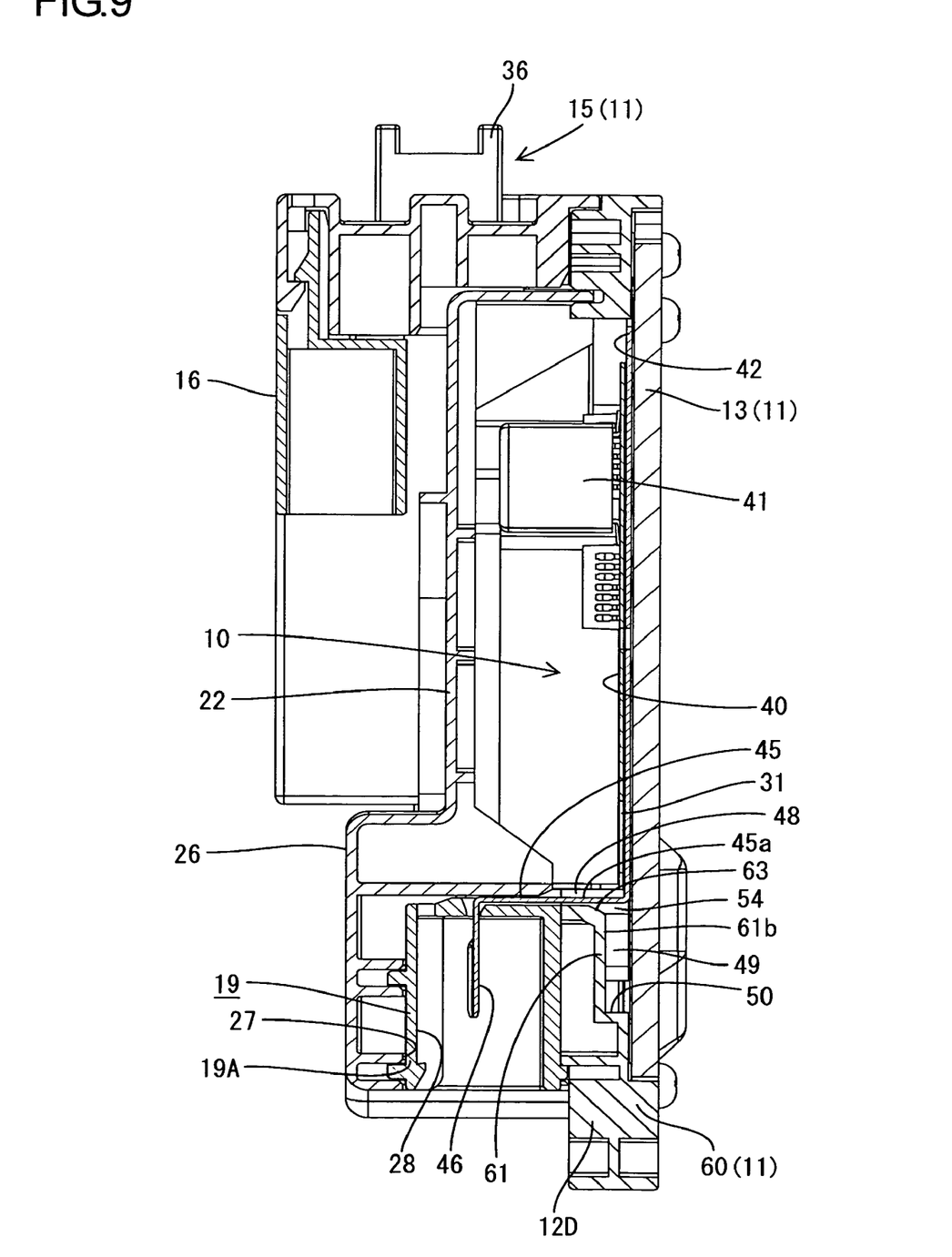
FIG. 9 is a cross-sectional view of an electric connection box according to another aspect of the present invention.
Figure 10:
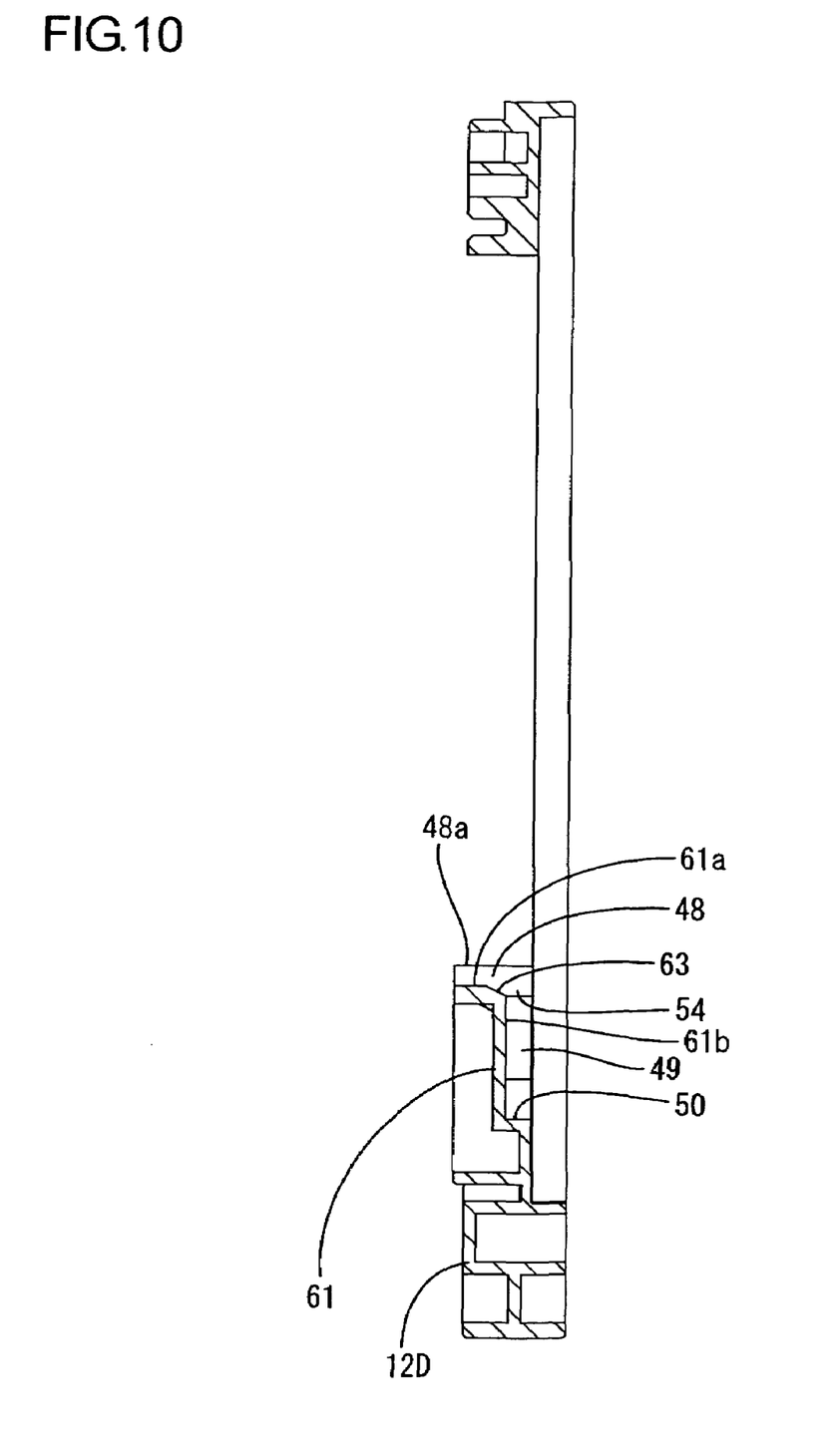
FIG. 10 is a cross-sectional view of a frame according to the other aspect.
Figure 11:
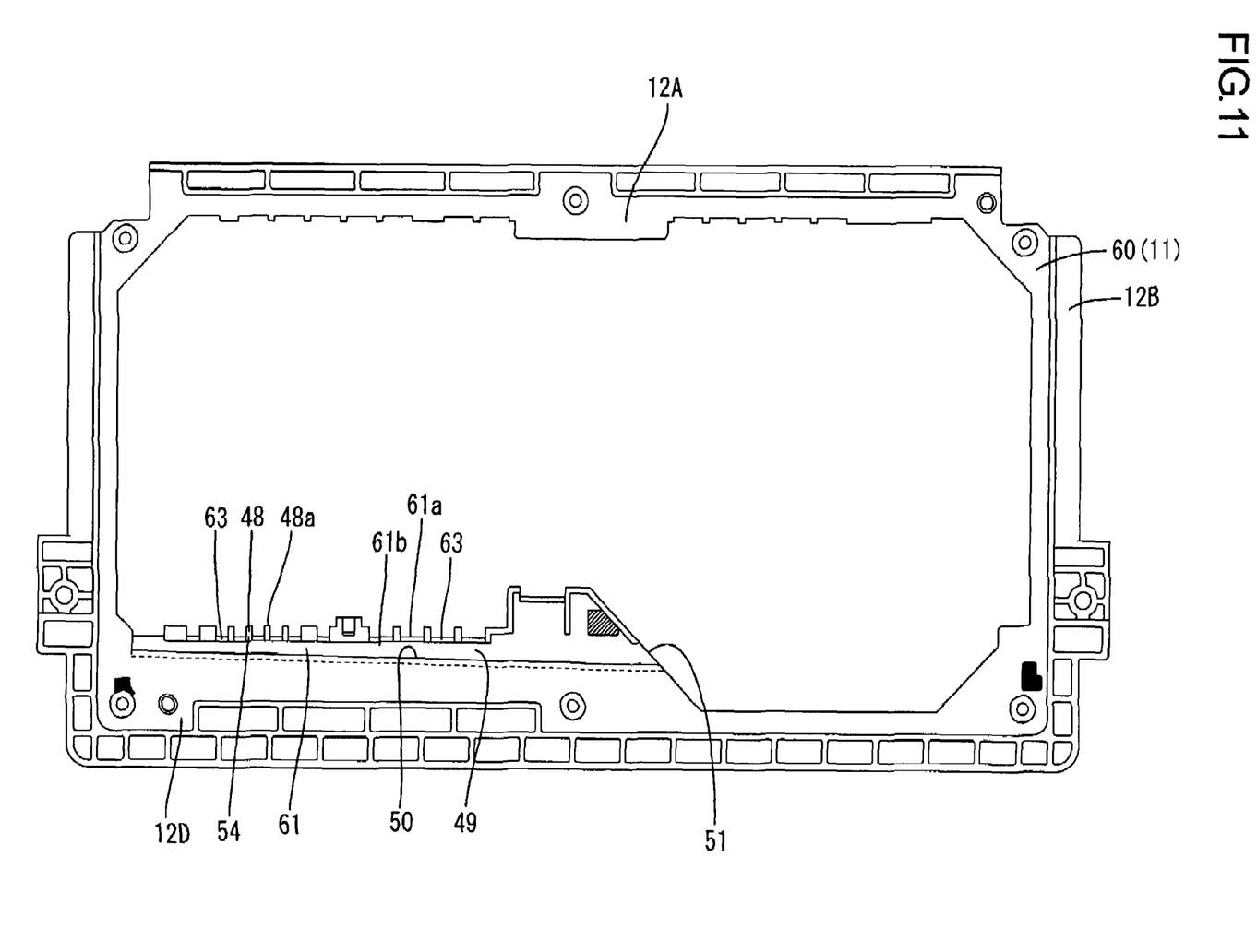
FIG. 11 is a rear surface view of the frame according to the other aspect.

Next, another embodiment will be described with reference to FIG. 9 to FIG. 11. In this other aspect, the shape of a frame 60 is different to that of the frame in the above described aspect. Since the remaining structures are the same as in the above described aspect, the same symbols are assigned for the same structures and descriptions of the configuration, action and effects of these structures are omitted.

The barrier walls 48 formed in a support part 61 of the frame 60 are disposed so as to correspond with an end (right end in FIG. 9 and FIG. 10) on the rear surface side of the curved part 45 in the length direction of a horizontal curved part 45 of the bus bar 42. Further, a top edge 48a of the barrier wall 48 is roughly parallel with the curved part 45, i.e. it is horizontal, and the top edge 48a of the barrier wall 48 is at a higher position than a top surface 45a of the curved part 45 in a state in which the curved part 45 contacts against (is mounted on) a horizontal top surface 61a of the support part 61. More specifically, the top edge of the barrier wall 48 protrudes further upward than the top surface 45a of the curved part 45. Since the top edge of the barrier wall 48 protrudes further upward than the top surface 45a of the curved part 45 in this manner, the distance between edge surfaces of adjacent curved parts 45 is large in comparison to a configuration in which the top edge of the barrier wall is the same height as or a lower height than the top surface of the curved part, and the reliability of the function to prevent short circuits between the bus bars 42 is thus superior.

Further, a guide slope 63 having a notch shape is formed diagonally (so as to form a downslope from the top surface 61a towards the rear side) in the support part 61 from a top surface 61a thereof to the top edge of a side surface 61b (that is, the inside surface of the concave portion 49) on the side of the first water drainage slope 50. By forming this kind of guide slope 63, water that runs from the circuit board 10 to the top surface 61a of the support part 61 via the curved part 45 of the bus bar 42 runs along the guide slope 63 and is led to a side surface 61b on the first water drainage slope 50 side, and thus it is able to reach the first water drainage slope 50. Accordingly, it is possible to discharge the water that ran to the support part 61 to outside the housing 11.

The embodiments according to the present invention are not limited to the configurations described by the above descriptions and drawings, and for example, the following embodiments are also included within the technical scope of the present invention.

Although four drainage ports 53 are provided in the configurations described above, other embodiments according to the present invention can include between one and three drainage ports or five or more drainage ports may be provided.

When the curved parts 45 of the bus bars 42 are insulated by coating with, for example, a waterproof sealing agent, the barrier walls 48 can be omitted.

Although in the above described configuration the circuit board 10 is disposed vertically such that the board surface is disposed in a substantially vertical condition, other embodiments according to the present invention can include the circuit board 10 positioned horizontally so that the board surface is disposed in a substantially horizontal condition.

Although in the above described configuration the lower end of the barrier wall 48 is employed as the draining rib 54, other embodiments according to the present invention can include a configuration in which separate members are employed for the barrier wall 48 and the draining rib 54.

In the above description, although the top edge of the barrier wall 48 is configured to project further upward than the top surface of the curved part 45, other embodiments according to the present invention can include the top edge of the barrier wall 48 being the same height as the top surface of the curved part 45 or being lower than the top surface of the curved part 45.

In the above description, although the water drainage slopes 50 and 52 and the drainage ports 53 were provided in the frame 12 constituting the housing 11, other embodiments according to the present invention can include water drainage slopes 50 and 52 and the drainage ports 53 being provided in a member other than the frame 12 among the members constituting the housing 11.

What is claimed is:

1. An electric connection box, comprising:
   a circuit board;
   a housing including the circuit board positioned in a vertical state, having a bottom wall below the circuit board, and a frame including a frame shape along a periphery of the circuit board, wherein an edge part corresponding to a lower edge of the circuit board forms the bottom wall; a cover that blocks an opening part of one surface side of the frame; and a heat sink that blocks an opening part of another surface side of the frame;
   a water drainage slope that is provided in the bottom wall of the frame and formed in the bottom wall of the housing, the water drainage slope being structured to receive fluid and is structured in a downslope to guide the fluid downward;
   a drainage port provided in the bottom wall of the frame and positioned in a lowermost part of the water drainage slope in the bottom wall of the housing, the drainage port is structured to communicate both inside and outside the housing.

2. The electric connection box according to claim 1, wherein
   the circuit board is provided along a plurality of bus bars in an insulating substrate and the bus bars are disposed side by side at a lower edge of the insulating substrate;
   a curved part that is structured to be substantially perpendicular to a board surface of the circuit board is provided at a portion of the bus bar that protrudes downward from a lower edge of the insulating substrate; and a support part that supports the curved part by contacting from below, wherein the support part is provided in the bottom wall of the housing, further wherein the water drainage slope is formed in the support part.

3. The electric connection box according to claim 2, wherein a guide slope in a notched shape is formed diagonally in the support part of the housing from a top surface thereof to a side surface on the water drainage slope side.

4. The electric connection box according to claim 3, wherein a barrier wall that protrudes between the bus bars is provided in the support part of the housing.

5. The electric connection box according to claim 4, further comprising a draining rib for guiding fluid being positioned above the water drainage slope and at a lower end of the barrier wall.

6. The electric connection box according to claim 5, wherein the barrier wall is positioned to correspond with the curved part of the bus bar, and a top edge of the barrier wall is positioned to protrude above a top surface of the curved part.

7. The electric connection box according to claim 6, further comprising a connector having a connector housing that is able to connect with a counterpart connector, wherein the connector is positioned at the bottom wall of the electric connection box and is provided in a state in which a mating opening of the connector housing is oriented downward; and a tip of the bus bar is able to be introduced inside the mating opening to serve as a terminal fitting.

8. The electric connection box according to claim 7, wherein the drainage port is formed between the bottom wall of the frame and an external wall of the connector housing.

9. The electric connection box according to claim 8, wherein the electric connection box is mounted in a vehicle and controls distribution of power to electrical equipment installed in the vehicle.

10. An electric connection box, comprising:

a circuit board that is provided along a plurality of bus bars in an insulating substrate, the bus bars being disposed side by side at a lower edge of the insulating substrate;

a curved part structured to be substantially perpendicular to a board surface of the circuit board, and the curved part being positioned at a portion of the bus bar that protrudes downward from a lower edge of the insulating substrate;

a support part that supports the bus bar from below, wherein the support part is provided in the bottom wall of the housing, further wherein the fluid drainage slope is form in the support part;

a housing including the circuit board positioned in a vertical state and including a bottom wall below the circuit board;

a water drainage slope that is formed in the bottom wall of the housing, the water drainage slope being structured to receive fluid and is structured in a downslope to guide the fluid downward; and a drainage port positioned in a lowermost part of the water drainage slope in the bottom wall of the housing, and structured to communicate both inside and outside the housing.

11. The electric connection box according to claim 10, wherein a guide slope in a notched shape is formed diagonally in the support part of the housing, the guide slope extending from a top surface thereof to a side surface on the water drainage slope side.

12. The electric connection box according to claim 10, wherein a barrier wall that protrudes between the bus bars is provided in the support part of the housing.

13. The electric connection box according to claim 12, further comprising a draining rib for guiding fluid being positioned above the water drainage slope and at a lower end of the barrier wall.

14. The electric connection box according to claim 12, wherein the barrier wall is positioned so as to correspond with the curved part of the bus bar, further wherein a top edge of the barrier wall is formed to protrude above a top surface of the curved part.

15. The electric connection box according to claim 10, further comprising a connector having a connector housing that is able to connect with a counterpart connector, wherein the connector is positioned at the bottom wall of the electric connection box and is provided in a state in which a mating opening of the connector housing is oriented downward; and a tip of the bus bar is able to be introduced inside the mating opening to serve as a terminal fitting.

16. The electric connection box according to claim 15, wherein the drainage port is formed between the bottom wall of the frame and an external wall of the connector housing.

17. The electric connection box according to claim 1, wherein the electric connection box is mounted in a vehicle and controls distribution of power to electrical equipment installed in the vehicle.

\* \* \* \* \*